United States Patent
Prabha et al.

(10) Patent No.: US 11,463,059 B1
(45) Date of Patent: Oct. 4, 2022

(54) SYSTEMS AND METHODS FOR LINEAR VARIABLE GAIN AMPLIFIER

(71) Applicant: Marvell Asia Pte. Ltd., Singapore (SG)

(72) Inventors: Praveen Prabha, San Jose, CA (US); Karthik Raviprakash, San Jose, CA (US); Luke Wang, San Jose, CA (US); Stephane Dallaire, Gatineau (CA)

(73) Assignee: Marvell Asia Pte Ltd., Singapore (SG)

(*) Notice: Subject to any disclaimer, the term of this patent is extended or adjusted under 35 U.S.C. 154(b) by 0 days.

(21) Appl. No.: 17/210,080

(22) Filed: Mar. 23, 2021

(51) Int. Cl.
 *H03G 3/30* (2006.01)
 *H03F 3/45* (2006.01)
 *H03G 1/00* (2006.01)
 *H03G 3/00* (2006.01)

(52) U.S. Cl.
 CPC ......... *H03G 3/3036* (2013.01); *H03G 1/0088* (2013.01); *H03G 3/001* (2013.01); *H03F 3/45183* (2013.01); *H03G 2201/502* (2013.01)

(58) Field of Classification Search
 CPC .... H03G 3/3036; H03G 1/0088; H03G 3/001; H03G 2201/502; H03F 3/45; H03F 3/45183
 USPC .................................................. 330/252–261
 See application file for complete search history.

(56) References Cited

U.S. PATENT DOCUMENTS

| | | | | |
|---|---|---|---|---|
| 10,498,526 | B1* | 12/2019 | Forey | H03L 7/07 |
| 2005/0024142 | A1* | 2/2005 | Sowlati | H03G 1/0023 |
| | | | | 330/254 |
| 2005/0218982 | A1* | 10/2005 | Martins | H03F 3/21 |
| | | | | 330/255 |

\* cited by examiner

*Primary Examiner* — Samuel S Outten
*Assistant Examiner* — Khiem D Nguyen

(57) ABSTRACT

The present invention is directed to electrical circuits. In a specific embodiment, the present invention provides variable gain amplifier that includes an impedance ladder and a control circuit. The impedance ladder includes n switches configured in parallel. The control circuit includes a digital-to-analog converter and an amplifier. The control circuit generates n control signals for the n switches. There are other embodiments as well.

18 Claims, 10 Drawing Sheets

SYSTEMS AND METHODS FOR LINEAR VARIABLE GAIN AMPLIFIER

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits and techniques thereof.

A variable gain amplifier (VGA) has many applications. Typically, a variable-gain or voltage-controlled amplifier is an electronic amplifier that varies its gain depending on a control voltage (CV)/digital control word. VGAs have many applications, including audio level compression, synthesizers, amplitude modulation, and others. For example, a VGA can be implemented by first creating a voltage-controlled resistor (VCR), which is used to set the amplifier gain. The VCR can be produced by one or more transistors with simple biasing. In certain implementations, VGAs are implemented using operational trans-conductance amplifiers (OTA). Sometimes, VGAs are implemented for automatic gain control (AGC) applications. Typically, VGA performance can be measured in terms of gain range, the linearity of electrical characteristics, distortion, tunability, and bandwidth.

Over the past, many types of conventional variable gain amplifiers have been proposed and implemented in different applications. Unfortunately, existing variable gain amplifiers are inadequate, as explained below. It is thus desirable to have new and improved variable gain amplifiers.

BRIEF SUMMARY OF THE INVENTION

The present invention is directed to electrical circuits. In a specific embodiment, the present invention provides a variable gain amplifier that includes an impedance ladder and a control circuit. The impedance ladder includes n switches configured in parallel. The control circuit includes a digital-to-analog converter and an amplifier. The control circuit generates n control signals for the n switches. There are other embodiments as well.

According to an embodiment, the present invention provides a variable gain amplifier device that includes a first input switch coupled to a first differential input. The device also includes a second input switch coupled to a second differential input. The device also includes a degeneration resistor coupled to the first input switch and the second input switch. The device also includes an impedance ladder circuit configured in parallel with the degeneration resistor. The impedance ladder circuit may include n switches. The n switches may be configured with a predetermined scale. The device also includes a control circuit configured to generate n control signals for the n switches. The control circuit may include a digital-to-analog converter (DAC) and an operational transconductance amplifier (OTA) and a plurality of reference resistors. The OTA may be configured in a feedback loop.

According to another embodiment, the present invention provides a receiver device that includes an input terminal for receiving an input signal. The device also includes a termination circuit for adjusting the input signal. The device also includes an equalizer configured to equalize the input signal and generate an equalized signal. The device also includes a variable gain amplifier (VGA) configured to adjust the equalized signal by a gain factor. The VGA may include adjustable impedance. The adjustable impedance may include an impedance ladder and a control circuit. The impedance ladder may include n switches. The control circuit may include a digital-to-analog converter (DAC) and an amplifier. The control circuit is configured to generate n control signals for the n switches. The amplifier is configured in a feedback loop.

According to yet another embodiment, the present invention provides a variable gain amplifier device that is characterized by a gain factor. The variable gain amplifier device includes an impedance ladder circuit characterized by an impedance value. The impedance value is associated with the gain factor. The impedance ladder circuit may include n switches. The n switches are configured with a predetermined scale. The device also includes a digital-to-analog converter (DAC) configured to convert a control code to a DAC signal. The device also includes an operational transconductance amplifier (OTA) that may include a first input and a second input and an output. The first input is coupled to the DAC signal. The second input is coupled to the output. The device also includes a plurality of reference resistors coupled to the output. The device also includes a current source coupled to the plurality of reference resistors. The device also includes n control terminals coupled to the n switches and the plurality of reference resistors.

It is to be appreciated that embodiments of the present invention provide many advantages over conventional techniques. Compared to conventional techniques, VGA architecture according to embodiments of the present invention can provide a high level of linearity and tunability.

Embodiments of the present invention can be implemented in conjunction with existing systems and processes. For example, existing communication devices such as SerDes can readily incorporate embodiments of the present invention. VGA architectures according to embodiments of the present invention can take advantage of front end CTLE configurations that are already parts of communication devices. Embodiments of the present invention are compatible with existing manufacturing processes and equipment. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
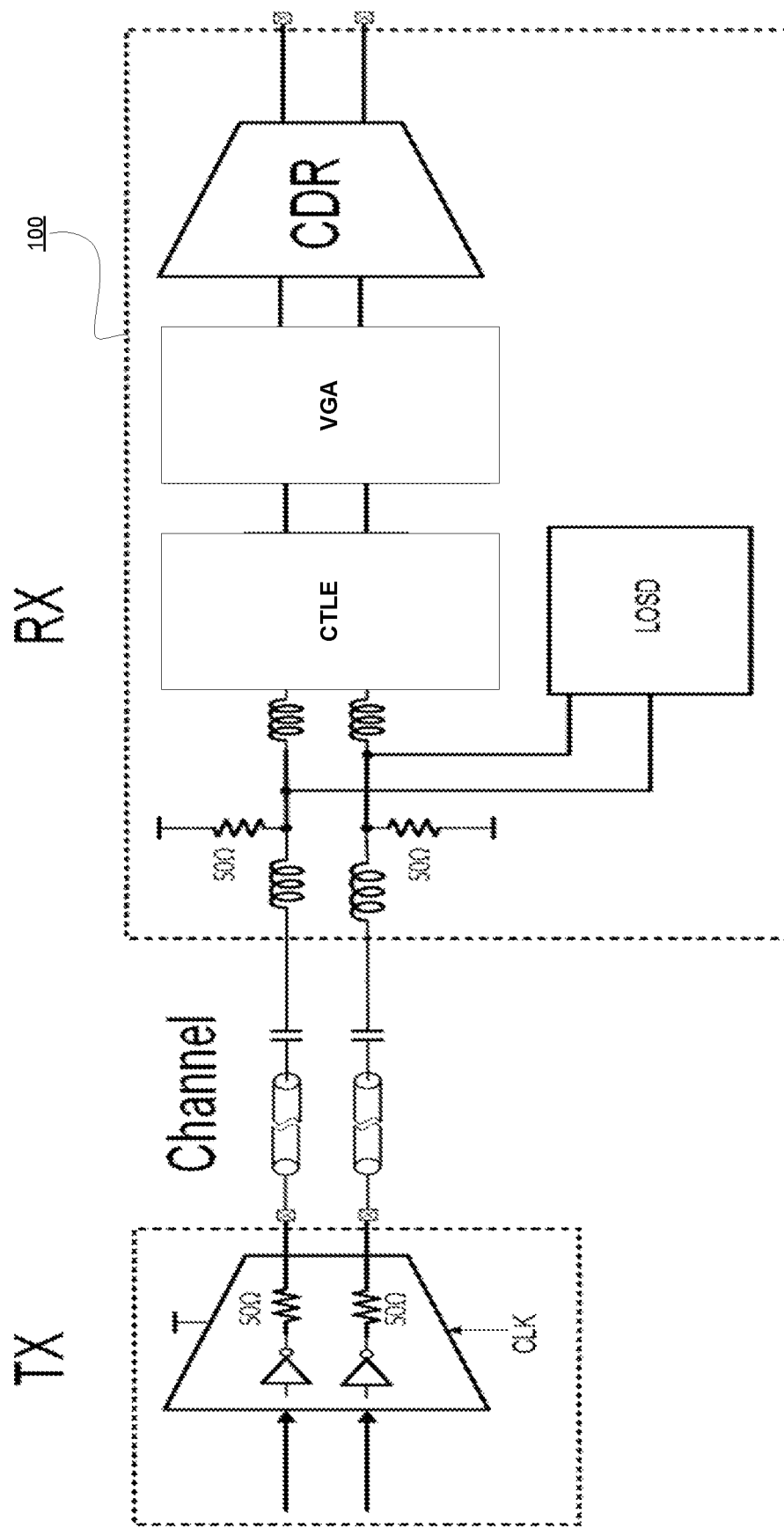
FIG. 1A is a simplified block diagram illustrating a communication system according to embodiments of the present invention.

The present invention is directed to electrical circuits. In a specific embodiment, the present invention provides a variable gain amplifier that includes an impedance ladder and a control circuit. The impedance ladder includes n switches configured in parallel. The control circuit includes a digital-to-analog converter and an amplifier. The control circuit generates n control signals for the n switches. There are other embodiments as well.

Various embodiments of the present invention afford linearization of variable gain amplifiers (VGA), which can be used for high-speed wireline communication link receivers. Exemplary VGAs, as described below, eliminate the need for a high-resolution digital-to-analog converter (DAC) for gain calibration by using a control circuit (e.g., a ramp circuit) based on an operational transconductance amplifier (OTA). For example, an exemplary ramp circuit includes an OTA and a medium-resolution DAC. An exponential scaling of the degeneration metal oxide semiconductor (MOS) devices is used to provide good linearity and small gain steps during VGA calibration (when used in conjunction with ramp circuits). It is to be appreciated that exponential scaling of degeneration device—implemented without the need resistors configured in series—allows for the optimum area, speed, and linearity.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

As explained above, variable gain amplifiers (VGA) have a wide range of applications. For example, VGAs are often used in communication applications. For example, as a part of a serializer/deserializer (SerDes) system, a VGA can be used to amplify the amplitude of the received analog signal before other processing techniques (e.g., clock recovery, ADC conversion, etc.) are performed. Depending on the actual application and implementation of VGAs, there are various desirable VGA characteristics, such as low noise, small parasitic capacitance on the output nodes, and high linearity.

It is to be appreciated that according to various embodiments of the present invention, VGAs are implemented in conjunction with continuous-time linear equalizers. Continuous-time linear equalizers are typically included in various types of communication and data processing systems. For example, a SerDes system includes both a transmitter module and a receiver module. Received analog signals, transmitted as a differential pair, are first processed by a continuous-time linear equalizer (CTLE) and then amplified by a VGA. In various embodiments of the presentation invention, VGAs are implemented in conjunction with CTLE. Additionally, one or more digital-to-analog converters (DAC) are used to provide control signals for both the CTLE and the VGA.

It is to be appreciated that in a high-speed rate wireline receiver, equalization circuits are used to compensate for the loss of the channel and extend the maximum data rate. For example, an equalization circuit may be a CTLE and/or an analog implementation of a feed-forward equalizer (FFE). However, the use of such front-end circuits typically results in a reduction of signal amplitude which must be compensated for so that the final decision circuit has the maximum dynamic range to mitigate its input-referred noise and to ensure sufficiently short regeneration time to make an errorfree decision. This is done using a VGA with enough gain range which can be tuned using some sort of automatic gain control (AGC) calibration. For high data rates, the VGA design becomes challenging and involves optimizing the performance. For example, VGA performance can be measure in terms of large gain range, low power, high linearity with large input/output swing, small gain step (e.g., an order of 0.1-0.2 dB/step), large bandwidth to minimize frequency-dependent losses and/or settling error, and others. It is to be appreciated that embodiments of the present invention can achieve high performance under these metrics, as explained below.

FIG. 1A is a simplified block diagram illustrating a communication system according to embodiments of the present invention. This diagram is merely an example, which should not unduly limit the scope of the claims. One of ordinary skill in the art would recognize many variations, alternatives, and modifications. In FIG. 1, the transmitter (TX) transmits a data signal, as a differential signal, to the receiver (RX) via a pair of communication channels. For example, the communication channels can be existing copper wires. At the receiver, the input signals are received at the input terminals with inductor coils and input resistors that improve signal quality. The CTLE module is implemented as a part of the receiver. Input signals are equalized by the CTLE before further processing. For example, loss of signal detection (LOSD) module determines whether there is a signal being received. Once it is determined that there are signals coming from the transmitting entity (TX), equalization is performed by the CTLE module. On the other hand, if the LOSD module fails to detect the signal presence (or detecting a lack of signal presence), signal processing is not performed. For example, the CTLE module is used as a component of an analog front end portion of the communication device. The equalized signal, which is a differential pair, is then provided to the VGA as show. The VGA is specifically configured to amplify the received signal by a predetermined amount, and the VGA operates in conjunction with CTLE. For example, compared to conventional VGAs implemented with switchable resistor array, VGA implementations according to embodiments of the present invention offer improved performance by taking advantage of the CTLEs. It is to be appreciated that the use of CTLEs with VGAs takes advantage of the fact that CTLEs are essential front end circuit of the receiver devices. For example, receivers are generally implemented with CTLEs followed by one or more VGAs. For example, the VGA is configured to enable constant output voltage swing at the output for a different set of channel lengths by adjusting the gain control code. It is to be appreciated that VGAs according to an embodiment of the present invention help maintain linearity. The available signal swing at the output stage can be adjusted using VGAs. For ADC based communication links, automatic gain control often allows for reduced resolution and full-scale range requirement of the ADCs. As mentioned above, VGAs implemented according to embodiments of the present invention utilize OTA and impedance ladder to provide a high degree of tunability and linearity, among other benefits.

As shown in FIG. 1A, after equalization is performed by the CTLE module and adjusted by the VGA, signal processing such as clock data recovery (CDR), analog to digital conversion (ADC), and/or other processes are then performed. It is to be appreciated that the receiver illustrated in FIG. 1 can be used in a variety of applications and systems. For example, the receiver can be a part of a transceiver device. In various embodiments, receivers are implemented as parts of SerDes system.

Figure 1B:
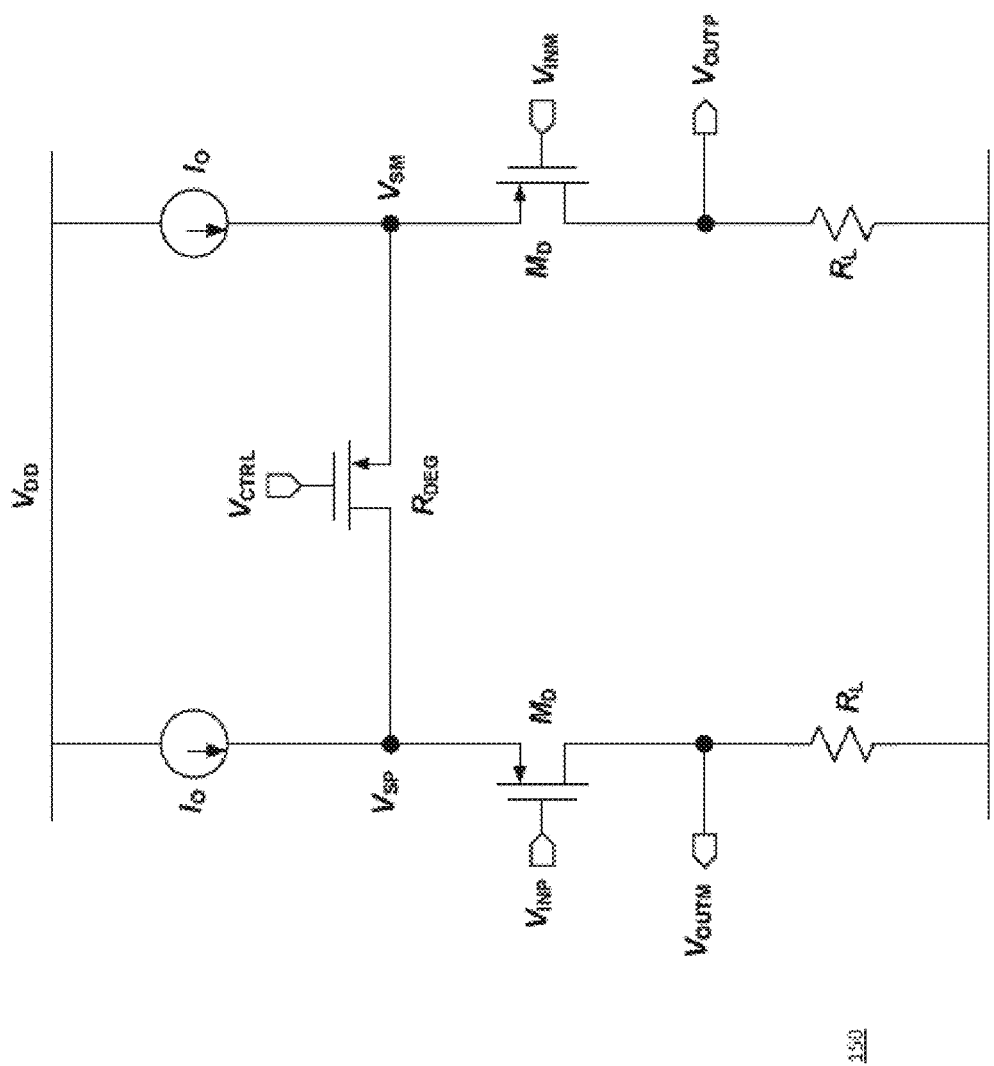
FIG. 1B is a simplified diagram of a VGA 150 according to embodiments of the present invention.

FIG. 1B is a simplified diagram of a VGA 150 according to embodiments of the present invention. This diagram is merely an example, which should not unduly limit the scope of the claims. One of ordinary skill in the art would recognize many variations, alternatives, and modifications. As an example, VGA 150 is a differentiation amplifier whose gain can be adjusted via degeneration resistor $R_{DEG}$. More specifically, the input stage consists of a P-type MOS (pMOS) differential pair with degeneration resistor ($R_{DEG}$), which may be implemented using another pMOS device. This degeneration resistance value can be adjusted using the $V_{CTRL}$ voltage which is provided usually by a high-resolution DAC. The load consists of a simple resistor ($R_L$) connected to the ground. Without loss of generality, this VGA can also be implemented using an N-type MOS (nMOS) as well. In a differential implementation, a common-mode feedback (CMFB) circuit might be needed for the output common mode. In various embodiments, the degeneration resistor $R_{DEG}$ is implemented using an impedance ladder designed according to embodiments of the present invention. As an example, the gain A of VGA 150 from the differential input ($V_{INP}-V_{INM}$) to the differential output ($V_{OUTP}-V_{OUTM}$) can be written as:

$$A = \frac{V_{OUT}}{V_{IN}} = \frac{2G_M R_L}{2 + G_M R_{DEG}}$$

where $G_M$ is the transconductance of the input device. For small swing across its source and drain terminals, the $R_{DEG}$ can be represented as a linear resistor of value $$R_{DEG} = \frac{1}{\beta(V_{CM} - V_{CTRL} - |V_T|)}$$

where $\beta$ is a constant which depends on the size (W/L) and other device parameters, $V_{CM}$ is the common-mode voltage at the sources of the input devices ($M_D$) and $V_T$ is the threshold voltage. As is evident, for small values of $V_{CTRL}$, the $R_{DEG}$ reduces, increasing the gain from input to output and vice versa.

By design, the $G_M$ is kept large for noise and speed reasons. For such large $G_M$, the gain for lower gain codes, can be approximated as $$A \approx \frac{2R_L}{R_{DEG}}$$

With a large $G_M$ assumption, the source terminals of the input differential pair see the full input differential signal without much attenuation.

The non-linearity of the VGA usually comes from two sources. The non-linearity of input pair $G_M$ is a function of the swing across its $V_{GS}$ and $V_{DS}$ terminals. The non-linearity of the degeneration switch also contributes to non-linearity, since the resistance realized with a MOS switch is inherently non-linear. The non-linearity caused by $G_M$ variation can be reduced by keeping the $G_M$ large enough and/or using local loops to suppress $V_{DS}$ variation. It is to be appreciated that degeneration resistor $R_{DEG}$ in VGA 150 is replaced by an impedance ladder circuit according to various embodiments, which improves the non-linearity caused by the degeneration switch $R_{DEG}$. As an example, an expression for the degeneration resistance is shown below:

$$R_{DEG} = \frac{1}{\beta(V_{CM} - V_{CTRL} - |V_T| - V_{IN})}$$

where $V_{IN}$ is the differential signal across the degeneration switch (same as input differential voltage when the input pair $G_M$ is large). Going back to the gain expression, $$A \approx \frac{2R_L}{R_{DEG}} = 2\beta R_L(V_{CM} - V_{CTRL} - |V_T| - V_{IN})$$

Since the gain itself is a function of $V_{IN}$ instead of being a constant value, $V_{OUT}$ contains higher harmonics of input frequency which explains the non-linear terms in VGA output. Thus, schemes to linearize the degeneration resistance linearize the transfer function and improves the non-linearity.

Over the past, there have been various techniques to improve VGA performance by modifying the degeneration resistor. For example, a regeneration resistor may be implemented with two switches of different sizes—each with its DAC and control voltage thereof—that provide improved linearity, but the improvement is limited, due to effective parallel resistance issues. As another example, there are VGA implementations with multiple DACs generating multiple control current for multiple switches, but this type of implementation usually results in a large area and power penalty.

Figure 2:
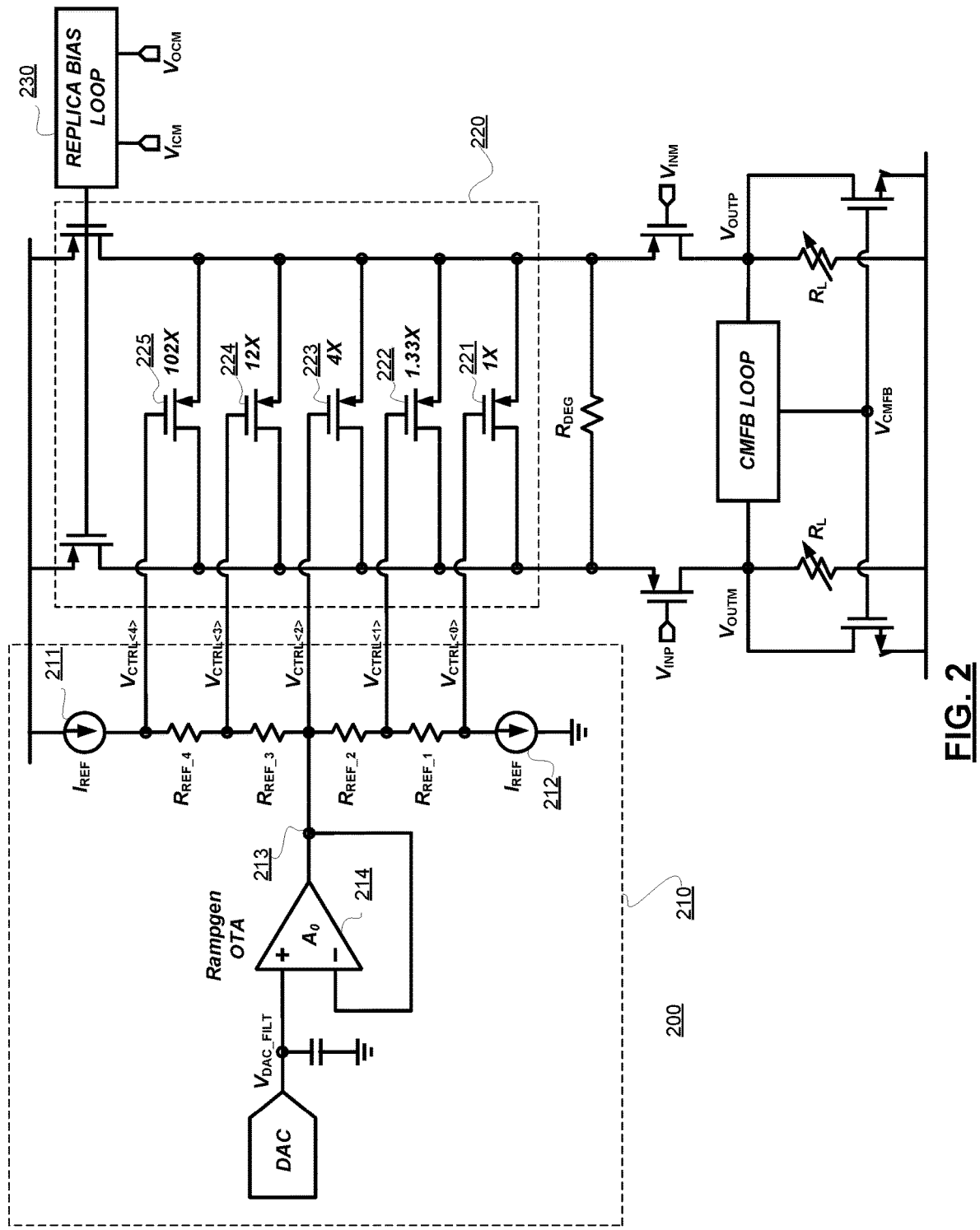
FIG. 2 is a simplified diagram of a VGA according to embodiments of the present invention.

FIG. 2 is a simplified diagram of a VGA according to embodiments of the present invention. This diagram is merely an example, which should not unduly limit the scope of the claims. One of ordinary skill in the art would recognize many variations, alternatives, and modifications. VGA 200 as shown is configured as a differential amplifier, with differential inputs ($V_{INP}$ and $V_{INM}$) and differential outputs ($V_{OUTM}$ and $V_{OUTP}$). For example, NMOS switches may be used as input switches as shown, but other types of switches (e.g., PMOS, BJT, etc.) can be used as input switches coupling to differential inputs as well. Load resistors $R_L$ and the common-mode feedback (CMFB) loop are coupled to the drain terminals of the input switches.

Figure 5:
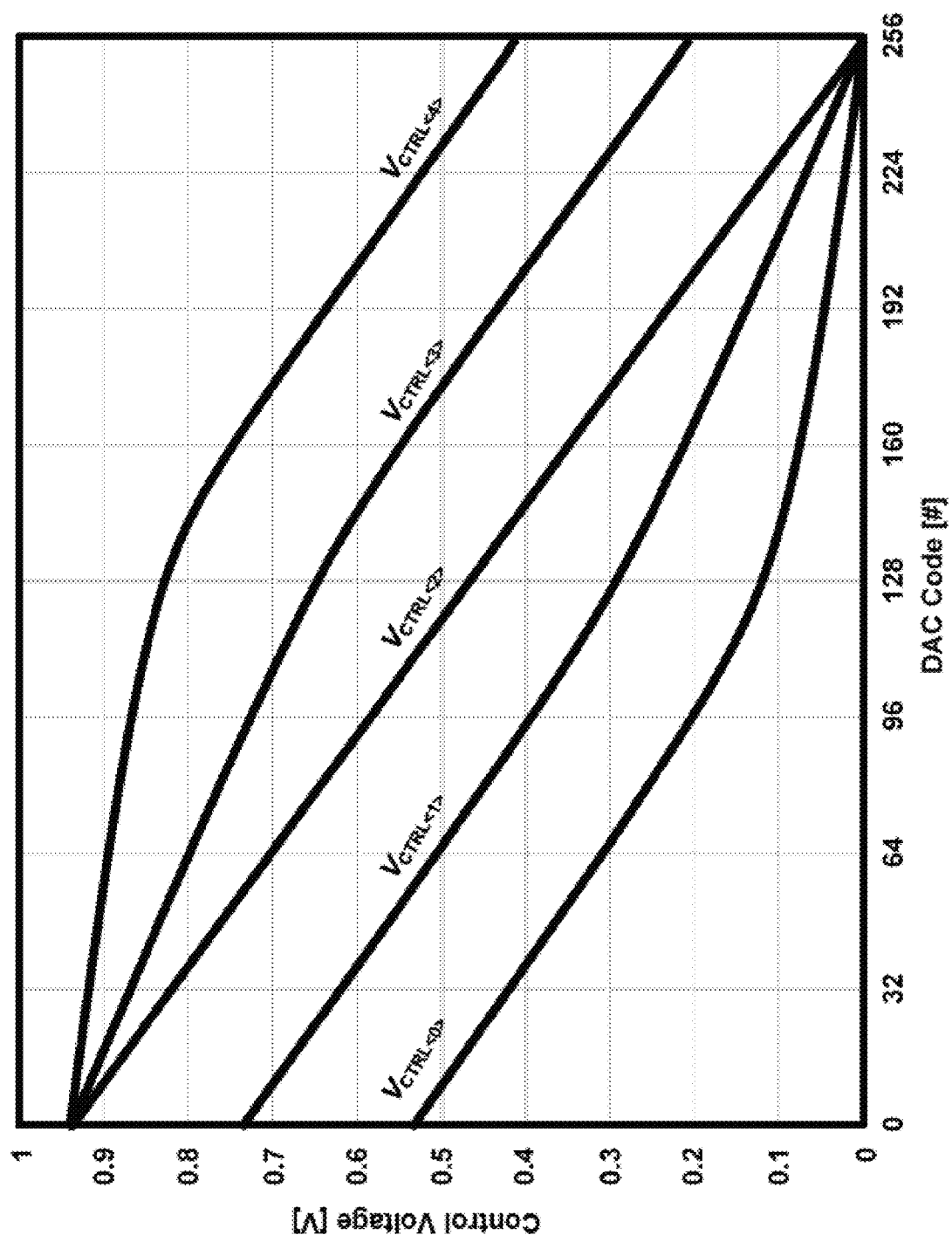
FIG. 5 is a plot illustrating an exemplary control voltage generation scheme according to embodiments of the present invention.

An impedance ladder 220 is configured in parallel to the degeneration resistor $R_{DEG}$, which is coupled to the source terminals of the input switches. It is to be understood that the gain of VGA 200 is adjusted via the impedance ladder 220; other components of VGA 200 may be modified or otherwise configured depending on the specific implementation. For example, impedance ladder 220 is configured as a degeneration device consists of five exponentially scaled switches in parallel, which can cover a large gain range with few devices (no resistors). In various embodiments, switches 221-225 are made from unit cells to ensure that the sizing ratio is accurate. The control circuit 210 provides control signals that are coupled to the respective switches at impedance ladder 220. Depending on the implementation, control circuit 210 generates n control signals for n switches at impedance ladder 220. As an example, FIG. 5 shows five control signals $V_{CTRL<0-4>}$ correspond to five switches 221-225. For example, the five control currents are based on five ramp-generated voltages that are used to linearize the VGA. It is to be appreciated that the impedance ladder 220 does not include resistors that might introduce non-linearity. At the control circuit side, the use of an OTA based ramp-gen circuitry improves the matching between degeneration switch controls and eliminates the need for series resistors in the degeneration switch. Among other benefits, various implementations according to the present disclosure provide an area and power-efficient solution for improving VGA non-linearity and gain step.

Figure 3:
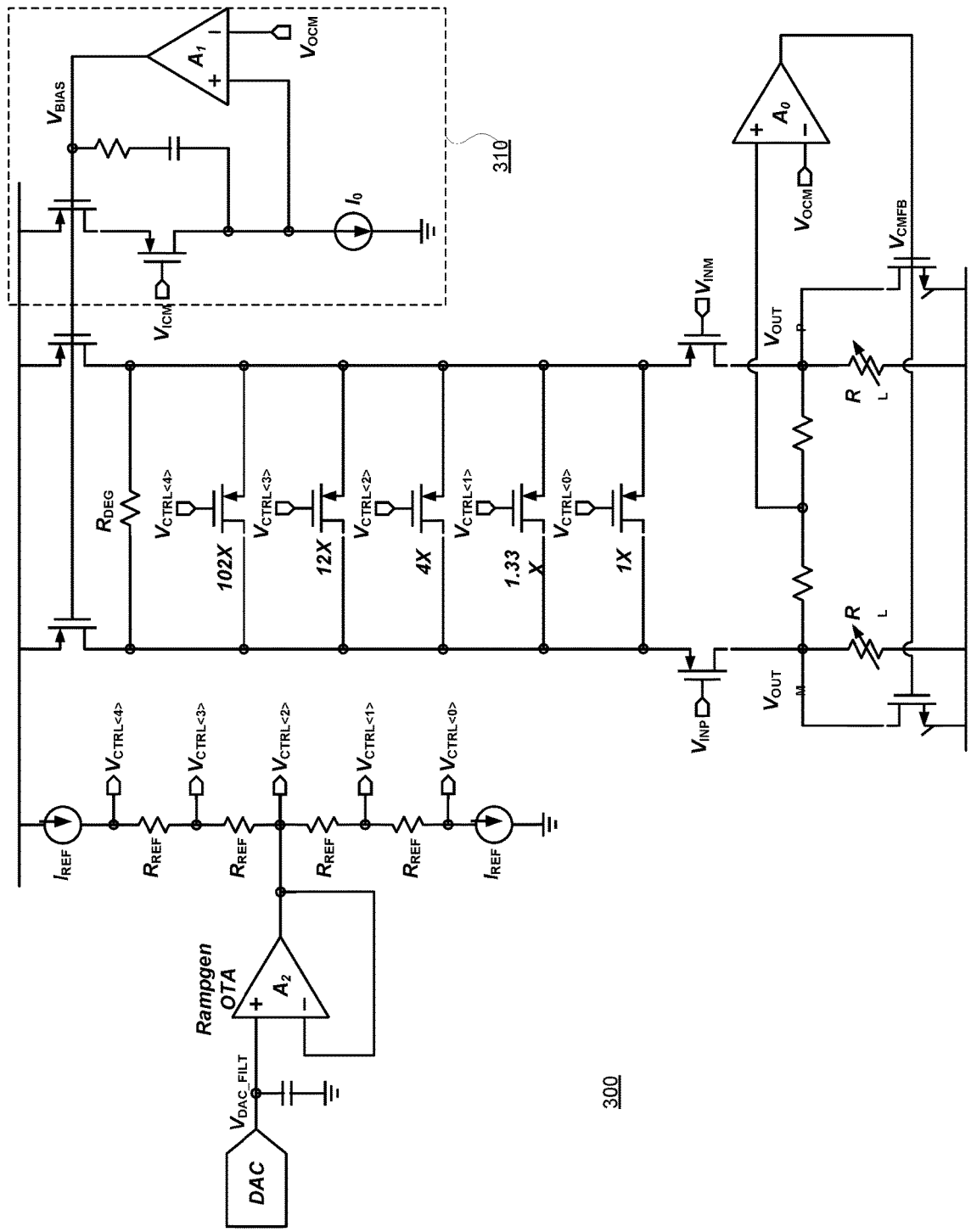
FIG. 3 is a simplified diagram of a VGA showing a bias loop and a feedback loop according to embodiments of the present invention.

FIG. 3 is a simplified diagram of VGA 300 showing a bias loop and a feedback loop according to embodiments of the present invention. This diagram is merely an example, which should not unduly limit the scope of the claims. One of ordinary skill in the art would recognize many variations, alternatives, and modifications. For example, VGA 300 is configured as a differential amplifier. Among other features, VGA 300 includes a replica bias loop 310 as shown. For example, bias loop 310 includes an amplifier $A_1$ that matches amplifier $A_2$, with $V_{OCM}$ as one of its inputs. Replica bias loop 310 is configured for generating optimum bias current. VGA also includes a CMFB loop for maintaining the right CM voltage at the output.

Figure 4:
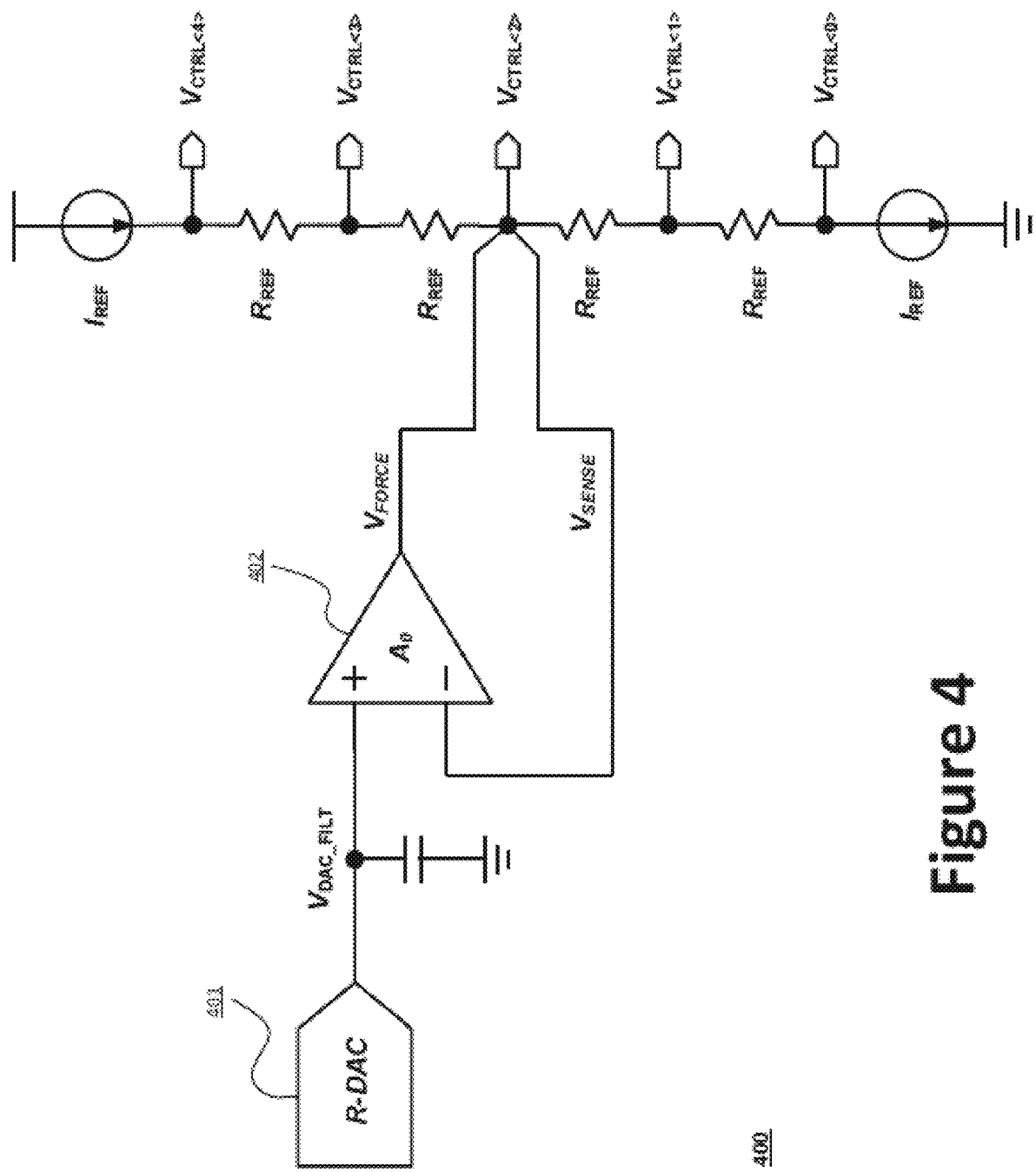
FIG. 4 is a simplified diagram illustrating a control circuit according to embodiments of the present invention.

FIG. 4 is a simplified diagram illustrating a control circuit according to embodiments of the present invention. This diagram is merely an example, which should not unduly limit the scope of the claims. One of ordinary skill in the art would recognize many variations, alternatives, and modifications. Control circuit 400 includes a DAC 401, amplifier 402, and output terminals configured with reference resistors $R_{REF}$. In various embodiments, DAC 401 receives a codeword (e.g., from a controller module) for generating a DAC output signal. For example, the codeword and the DAC output signal can be pre-calibrated to produce the desired gain at the VGA. The codeword may be generated by a controller or obtained from a lookup table (LUT).

The output of DAC 401 is coupled to amplifier 402. In various implementations, a filter (e.g., a capacitor) is configured between DAC 401 and amplifier 402. Amplifier 402 can be implemented using an OTA. For example, the ramp voltages are generated using a rail-to-rail OTA that maintains the $V_{CTRL<2>}$ at the same level as the DAC output. Other control signals (i.e., $V_{CTRL<1-4>}$) are generated by tapping higher or lower in the resistance ladder, which includes a reference current source $I_{REF}$ and reference resistors $R_{REF}$. As shown on FIG. 4, control signals $V_{CTRL<1-4>}$ correspond to different positions relative to reference resistors $R_{REF}$. By providing a large gain, OTA 402 works as a unity gain buffer for DAC 401 with the minimum error between its input and output. The output voltage $V_{FORCE}$ of the OTA can be written as $$\frac{V_{FORCE}}{V_{DAC\_FILT}} = \frac{A_0}{1+A_0}$$

where $A_0$ is the open-loop gain of the OTA 402. As is evident from the equation, for large values of $A_0$, the OTA output tracks its input (DAC output) with negligible error. For example, $V_{SENSE}$ as shown is configured as a feedback signal for OTA 402. With the added offset generation branch using $I_{REF}$ & $R_{REF}$, control circuit 400 affords a simple generation of positive and negative offsets from the DAC voltage without resorting to multiple current mirrors and offset currents.

In various implementations, OTA 402 only needs to drive the difference in top and bottom current sources, it can be designed with low power. The OTA used in this design is a complementary input stage (nMOS+pMOS) folded cascode opamp with a class AB driver which allows rail to rail input/output operation. The offset of the OTA is not a major concern since that can be corrected by just adjusting the DAC codes during calibration. As can be seen in FIG. 4, only a smaller number of devices are used, with common offset currents ($I_{REF}$) and matched poly resistors, control circuit 400 offers great matching between ramp voltage offsets.

Control circuit 400 also provides ramp voltages that are generated on a single series arm, as compared to parallel arms; its means that to increase the number of ramp voltages (or output control signals), the resistors (i.e., $R_{REF}$) can be split up, and taps can be configured between voltages. The design of control circuit 400 allows for efficient and convenient scaling much power penalty. For example, the control signals (or offset voltages) can be programmable by adjusting $I_{REF}$ or $R_{REF}$.

It is to be understood that to arrive at the optimum number of ramp controls needed and the ratio between different degeneration devices, it is important to carefully examine the constraints involved. As an example, the gain for the VGA when expressed in dB is as follows:

$$A_{dB} = 20 \log_{10}(2G_M R_L) - 20 \log_{10}(2 + G_M R_{DEG})$$

where $R_{DEG}$ is a function of the control voltage $V_{CTRL}$. Since $G_M$ & $R_L$ are independent of $V_{CTRL}$ and $G_M R_{DEG}$ is reasonably larger than 2, the gain can be expressed as:

$$A_{dB} \approx K - 20 \log_{10}(R_{DEG})$$

where K is a constant term. Thus, it can be seen that to get a linear $A_{dB}$, $R_{DEG}$ needs to be linear in dB scale, or in other words, $R_{DEG}$ should have an exponential dependence on $V_{CTRL}$ as:

$$R_{DEG} \approx R_C 10^{(mV_{CTRL}+b)}$$

In various embodiments, an exponential $R_{DEG}$ is obtained by shifting the individual degeneration resistance curves and scaling them exponentially so that the resultant parallel combination mimics an exponential function with minimum error. This is related to the individual MOS resistance variation (on a logarithmic scale in the y-axis) and the equivalent parallel resistance tracking an exponential resistance.

FIG. 5 is a plot illustrating an exemplary control voltage generation scheme according to embodiments of the present invention. This diagram is merely an example, which should not unduly limit the scope of the claims. One of ordinary skill in the art would recognize many variations, alternatives, and modifications. For example, the slope (DAC code vs. control voltage) control signals $V_{CTRL<0-4>}$ may be predetermined or pre-calibrated corresponding desired degeneration resistance, which translates to desired VGA gain.

Figure 6:
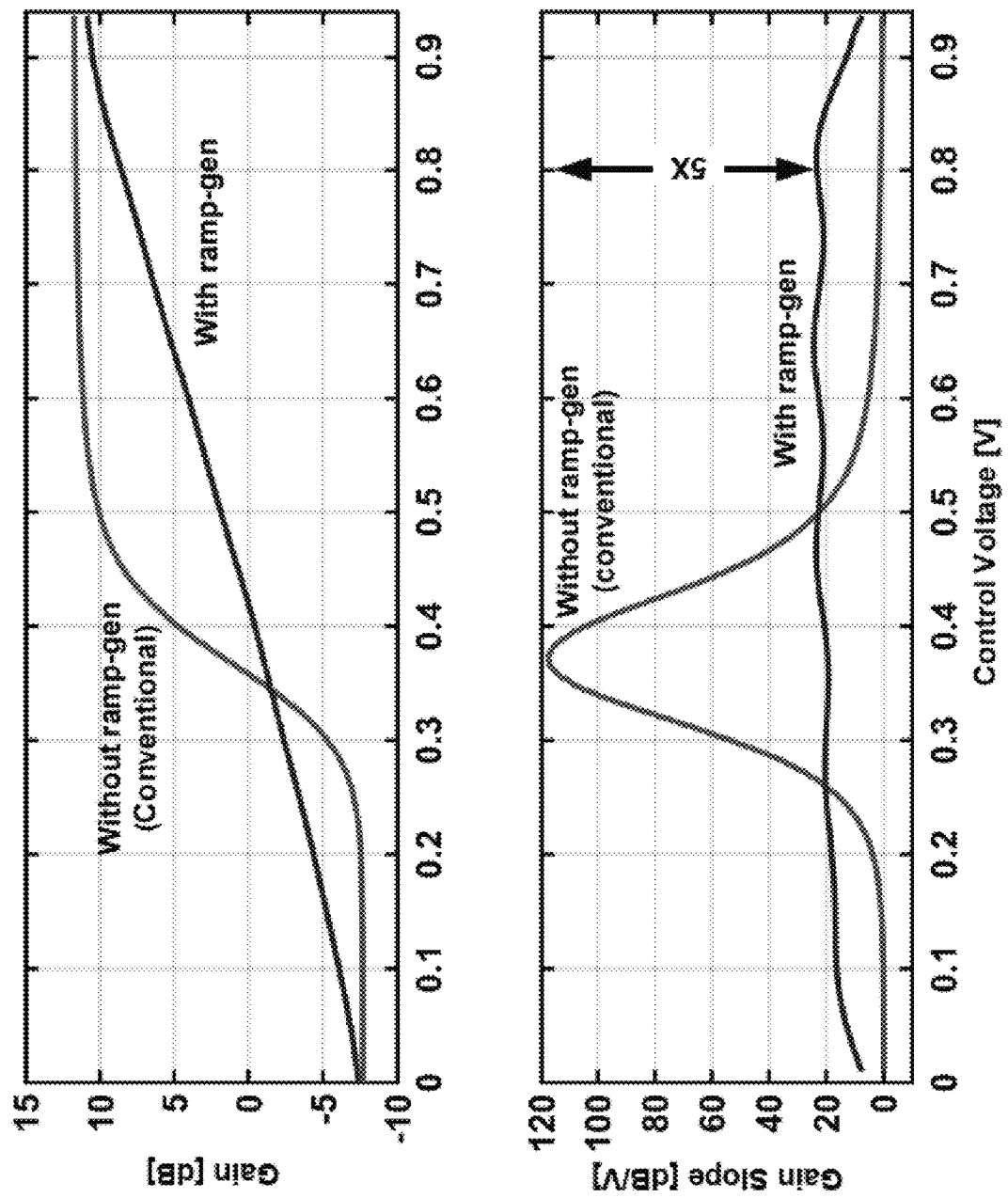
FIG. 6 provides plots illustrating an exemplary VGA gain relative to control voltage according to embodiments of the present invention.

FIG. 6 provides plots illustrating an exemplary VGA gain relative to control voltage according to embodiments of the present invention. This diagram is merely an example, which should not unduly limit the scope of the claims. One of ordinary skill in the art would recognize many variations, alternatives, and modifications. The top plot (showing control voltage vs. gain) shows that the ramp-gen circuit-based VGAs according to various embodiments offer a much higher level of linearity compared to conventional designs. The bottom plot (showing control voltage vs. gain slope) provides another way to show that the ramp-gen circuit based VGAs according to various embodiments provides a much higher level of linearity (up to 5 times as shown) compared to conventional designs; the improvement in the gain slope is about 5×, which can be directly translated to improvement in gain step. As explained above, ramp-generation circuitry according to various embodiments generates staggered control signals that turn on the degeneration devices from the lowest to the highest as DAC code increases. For each DAC code, the smallest (e.g., "weakest") device receives more gate drive than a bigger (e.g., "stronger") device that generates a linear resistance (in dB scale) as a function of the equivalent gate voltage.

Figure 7:
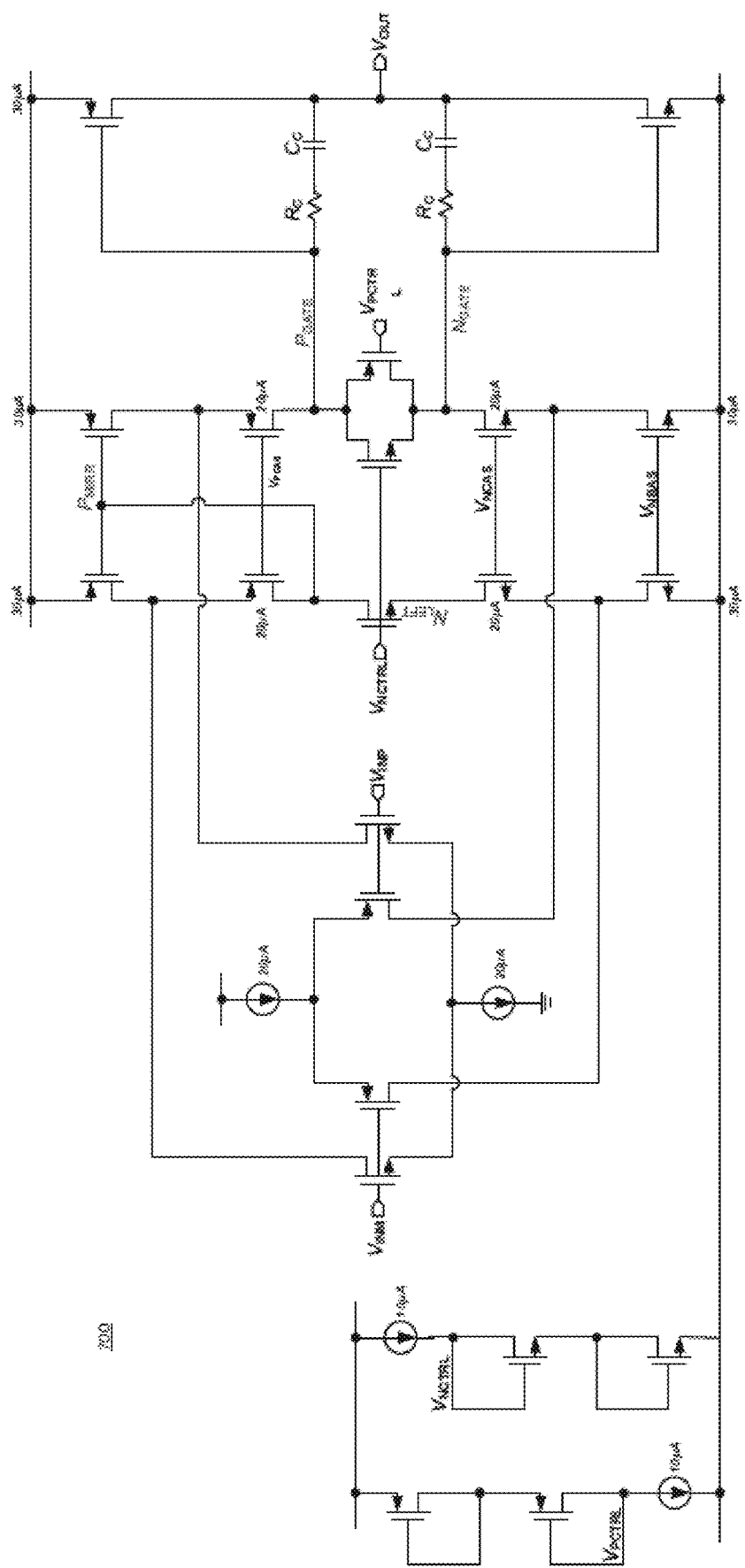
FIG. 7 is a simplified diagram illustrating an OTA 700 according to embodiments of the present invention.

FIG. 7 is a simplified diagram illustrating an OTA 700 according to embodiments of the present invention. This diagram is merely an example, which should not unduly limit the scope of the claims. One of ordinary skill in the art would recognize many variations, alternatives, and modifications. As explained above, an OTA used in a control circuit (e.g., control circuit 400 in FIG. 4) only needs to drive the difference in top and bottom current sources, it can be designed with low power. For example, OTA 700 includes a complementary input stage (nMOS+pMOS) folded cascode opamp with a class AB driver which allows rail-to-rail input/output operation. The offset of the OTA, as used in various implementations, is not a major concern since that can be corrected by just adjusting the DAC codes during calibration. It is to be appreciated that due to the presence of a smaller number of devices, common offset currents (e.g., $I_{REF}$ in FIG. 4) and improved matching of poly resistors (e.g., $R_{REF}$) over MOS, the control circuit (e.g., or ramp generation circuit) can offer great matching between ramp voltage offsets.

Figure 8:
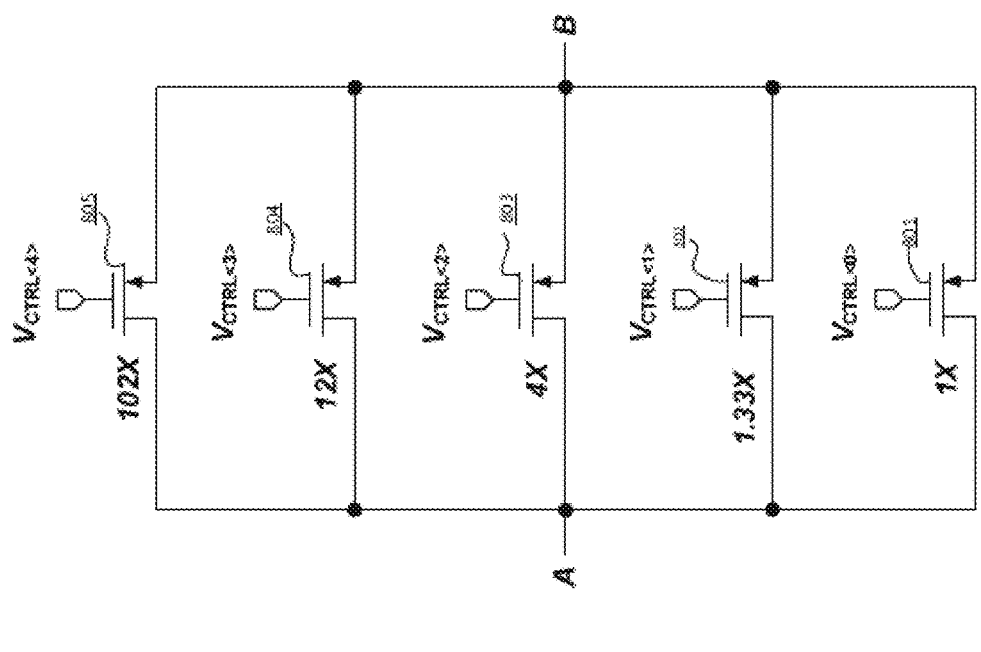
FIG. 8 is a simplified diagram illustrating an impedance ladder according to embodiments of the present invention.

FIG. 8 is a simplified diagram illustrating an impedance ladder according to embodiments of the present invention. This diagram is merely an example, which should not unduly limit the scope of the claims. One of ordinary skill in the art would recognize many variations, alternatives, and modifications. In various embodiments, impedance ladder 800 includes switches 801-805. It is to be appreciated that there is no resistor configured in the impedance ladder 800, and such configurations allow for a high level of linearity and efficiency. For example, switches 801-805—acting as variable resistors responsive to control signals—are implemented using MOS devices. In various embodiments, the number of switches corresponds to the number of control signals generated by the control circuits. For example, switches 801-805 are manufactured using the same semiconductor die and process, which allow for a high level of consistency and matching. The ratio among the switches—1x, 1.33x, 4x, 12x, 102x—is based on an exponential scale (i.e., for an exponential curve fit) and calibrated in conjunction with control signals, and it is configured for the convenient adjustment of the VGA. Depending on the implementation, the size and number of switches can be configured differently.

Figure 9:
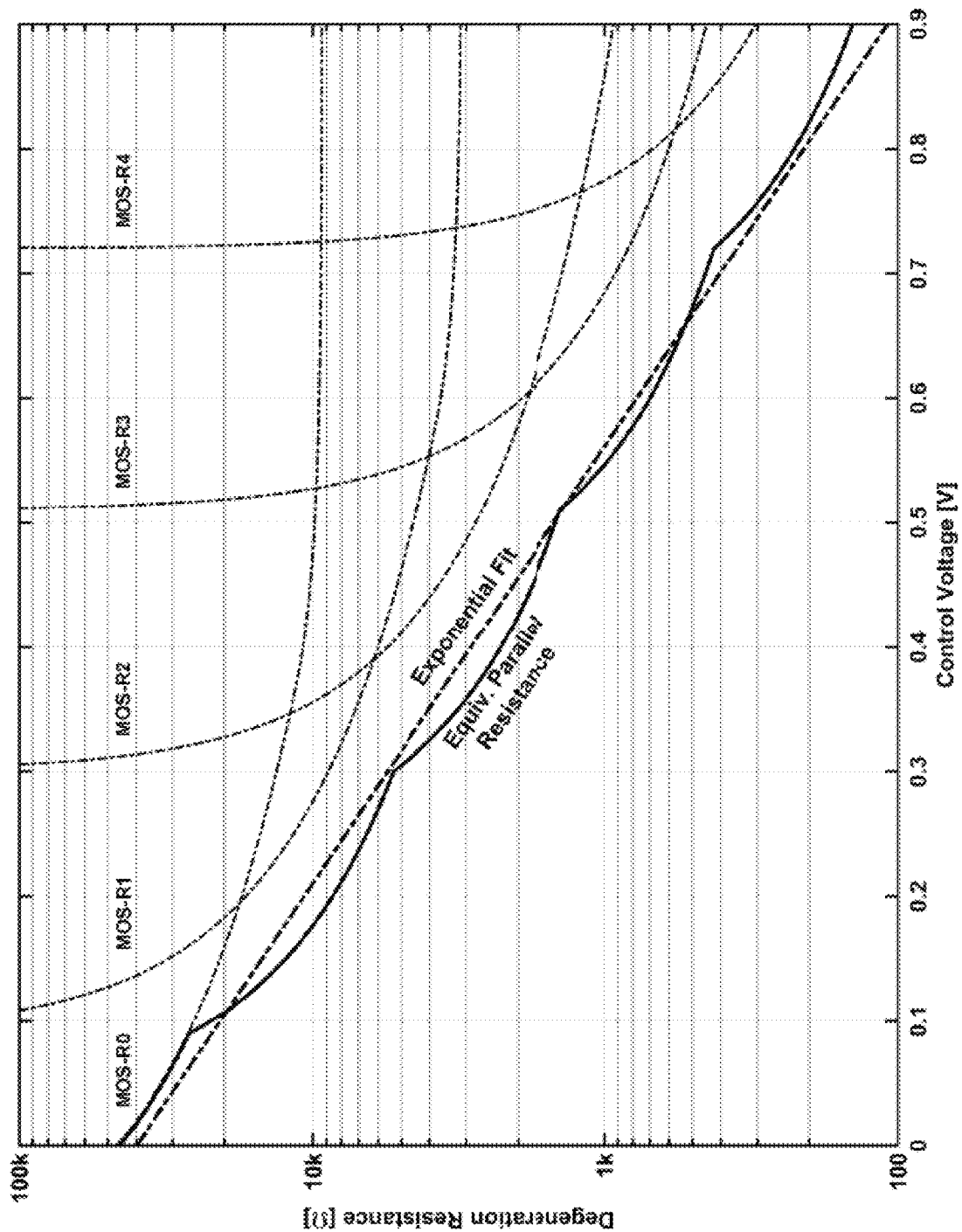
FIG. 9 is a simplified diagram illustrating degeneration resistance value relative to control voltage according to embodiments of the present invention.

FIG. 9 is a simplified diagram illustrating degeneration resistance value relative to control voltage according to embodiments of the present invention. This diagram is merely an example, which should not unduly limit the scope of the claims. One of ordinary skill in the art would recognize many variations, alternatives, and modifications. As explained above, degeneration resistance is associated with the impedance value of the impedance ladder, which is configured in parallel relative to the degeneration resistor.

The ratio among the switches of the impedance letter, in various embodiments, is associated with an exponential scale.

For example, the configuration of switches is mathematically equivalent to approximating a $10^{(mx+b)}$ function (exponential curve) with a scaled and shifted combination of $$\frac{1}{a(b-x)}$$

functions which depicts the degeneration resistance dependence. With more control voltages, the exponential function can be approximated with lesser error. It is to be noted that increasing the number of control lines increases the layout complexity; it may also worsen the matching performance since the offset voltage between them is smaller. For various applications, five control signals (corresponding to five switches) can be optimal in light of both performance and complexity.

To arrive at the actual ratio between the degeneration device sizes, the determination of switch ratio needs to factor into account that the VGA also has to meet a minimum gain range. For example, if $W_0$, $W_1$, $W_2$, $W_3$, and $W_4$ are the weights of the degeneration device sizes, then at the maximum gain, the equivalent strength of all devices in parallel would be:

$$W_{total} \approx W_0 + W_1 + W_2 + W_3 + W_4$$

In various embodiments, individual values of if $W_0$, $W_1$, $W_2$, $W_3$, and $W_4$ fall along an exponential curve (with $10^{mV_{CTRL}+b}$ dependence) while simultaneously adding up to a fixed $W_{total}$ to meet the gain range. For example, switch sizes can be determined using a system-level modeling/optimization tool, such as MATLAB and others. In certain embodiments, another fixed parallel resistance (e.g., such as resistor $R_{DEG}$ or other impedance elements) to ensure a minimum gain; the initial ratios may be tuned to accommodate for this fixed parallel resistance, as well as to compensate for any circuit non-idealities.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A variable gain amplifier comprising:
a first input switch configured to receive a first differential input of the variable gain amplifier;
a second input switch configured to receive a second differential input of the variable gain amplifier;
an impedance ladder circuit comprising a plurality of switches configured with a predetermined scale for adjusting a gain of the variable gain amplifier in response to a respective plurality of control signals; and
a control circuit to maintain a gain linearity of the variable gain amplifier, the control circuit configured to (i) receive a control voltage, (ii) apply a gain to the control voltage to generate a ramp voltage configured to ramp each of the respective control signals upward or downward as the control voltage varies, and (iii) generate the respective control signals for the plurality of switches based on the ramp voltage,
the control circuit comprising (i) a plurality of reference resistors coupled to an output of the control circuit and configured to generate the respective control signals based on the ramp voltage and (ii) first and second reference current sources coupled to the plurality of reference resistors and configured to regulate the respective control signals.

2. The variable gain amplifier of claim 1 wherein the predetermined scale is an exponential scale to configure the impedance ladder circuit to provide linear gain for an output signal of the variable gain amplifier.

3. The variable gain amplifier of claim 1 wherein the plurality of switches comprises metal oxide semiconductor switches.

4. The variable gain amplifier of claim 1 further comprising a bias loop coupled to the impedance ladder circuit and configured to generate a bias current input to the impedance ladder circuit.

5. The variable gain amplifier of claim 1, the control circuit comprising a digital-to-analog converter configured to convert a digital control code to the control voltage to adjust a gain of the variable gain amplifier.

6. The variable gain amplifier of claim 5, the control circuit comprising a ramp circuit coupled between the digital-to-analog converter and the impedance ladder circuit, the ramp circuit configured to apply the gain to the control voltage to generate the ramp voltage.

7. The variable gain amplifier of claim 6, the ramp circuit comprising an operational transconductance amplifier configured to function as a unity gain buffer for the control voltage.

8. The variable gain amplifier of claim 7, the operational transconductance amplifier being configured in a feedback loop with the ramp voltage.

9. The variable gain amplifier of claim 8, the operational transconductance amplifier having a first input coupled to the control voltage and a second input coupled to an output of the operational transconductance amplifier.

10. The variable gain amplifier of claim 1, wherein respective control signals of the plurality of control signals are output from different positions between the plurality of reference resistors.

11. The variable gain amplifier of claim 10, wherein the respective control signals are output via taps between adjacent ones of the plurality of reference esistors to provide different voltage values to the respective ones of the plurality of switches.

12. The variable gain amplifier of claim 1, wherein each of the plurality of control signals is generated based on the same ramp voltage.

13. A method of operating a variable gain amplifier, the method comprising:
receiving, at a first input switch, a first differential input of the variable gain amplifier;
receiving, at a second input switch, a second differential input of the variable gain amplifier;
using an impedance ladder circuit comprising a plurality of switches, adjusting a gain of the variable gain amplifier in response to a respective plurality of control signals;
receiving a control voltage;
applying a gain to the control voltage to generate a ramp voltage configured to ramp each of the respective control signals upward or downward as the control voltage varies to maintain a gain linearity of the variable gain amplifier;
generating the respective control signals for the plurality of switches based on the ramp voltage using a plurality of reference resistors coupled to first and second reference current sources configured to regulate the respective control signals.

14. The method of claim 13, further comprising using a digital-to-analog converter to convert a digital control code to the control voltage to adjust a gain of the variable gain amplifier.

15. The method of claim 14, further comprising applying the gain to the control voltage to generate the ramp voltage using a ramp circuit coupled between the digital-to-analog converter and the impedance ladder circuit.

16. The method of claim 15, further comprising using an operational transconductance amplifier as a unity gain buffer for the control voltage.

17. The method of claim 16, further comprising configuring the operational transconductance amplifier in a feedback loop with the ramp voltage.

18. The method of claim 17, further comprising coupling a first input of the operational transconductance amplifier to the control voltage and a second input of the operational transconductance amplifier to an output of the operational transconductance amplifier.

* * * * *